United States Patent
Bricaud et al.

[19]

[11] Patent Number: 6,053,748
[45] Date of Patent: Apr. 25, 2000

[54] PC CARD CONNECTION UNIT FOR MICRO SIM CARD

[75] Inventors: Herve' Guy Bricaud, Dole, France; Werner Biermann, Winterbach, Germany

[73] Assignee: ITT Manufacturing Enterprises, Inc., Wilmington, Del.

[21] Appl. No.: 08/837,421

[22] Filed: Apr. 17, 1997

[30] Foreign Application Priority Data

Apr. 18, 1996 [FR] France .................................. 96 04842

[51] Int. Cl.$^7$ ...................................................... H01R 9/09
[52] U.S. Cl. .......................................... 439/76.1; 439/946
[58] Field of Search .................................. 439/76.1, 946; 361/737

[56] References Cited

U.S. PATENT DOCUMENTS

| | | | |
|---|---|---|---|
| 5,505,628 | 4/1996 | Ramey et al. .................. | 439/76.1 OR |
| 5,563,400 | 10/1996 | Le Roux ......................... | 439/946.2 X |
| 5,752,857 | 5/1998 | Knights ............................. | 439/946 X |

FOREIGN PATENT DOCUMENTS

| | | |
|---|---|---|
| 0 480 334 A1 | 10/1991 | European Pat. Off. . |
| 0 595 025 A3 | 9/1993 | European Pat. Off. . |
| 91 14593 | 6/1992 | France . |
| 295 05 678 U | 4/1995 | Germany . |
| 296 02 632 U | 7/1996 | Germany . |

Primary Examiner—Michael L. Gellner
Assistant Examiner—Daniel Wittels
Attorney, Agent, or Firm—Thomal L. Peterson

[57] ABSTRACT

A PC card (30) of standard PCMCIA outside dimensions can connect a Micro Sim card C to a host connector 16 that lies at the rear end of a host passageway 12. The PC card has a housing 10 that includes shell halves (32, 34) with horizontal upper and lower parallel plane main walls (44, 46), which, between them, form a cavity (48) holding a circuit board (36). A small card connector (64) for receiving the Micro Sim card lies on the upper face (37) of the circuit board (36). The upper PC card shell half (32) has a slot (80) for insertion or extraction of the Micro Sim card (C) from the small card connector.

24 Claims, 12 Drawing Sheets

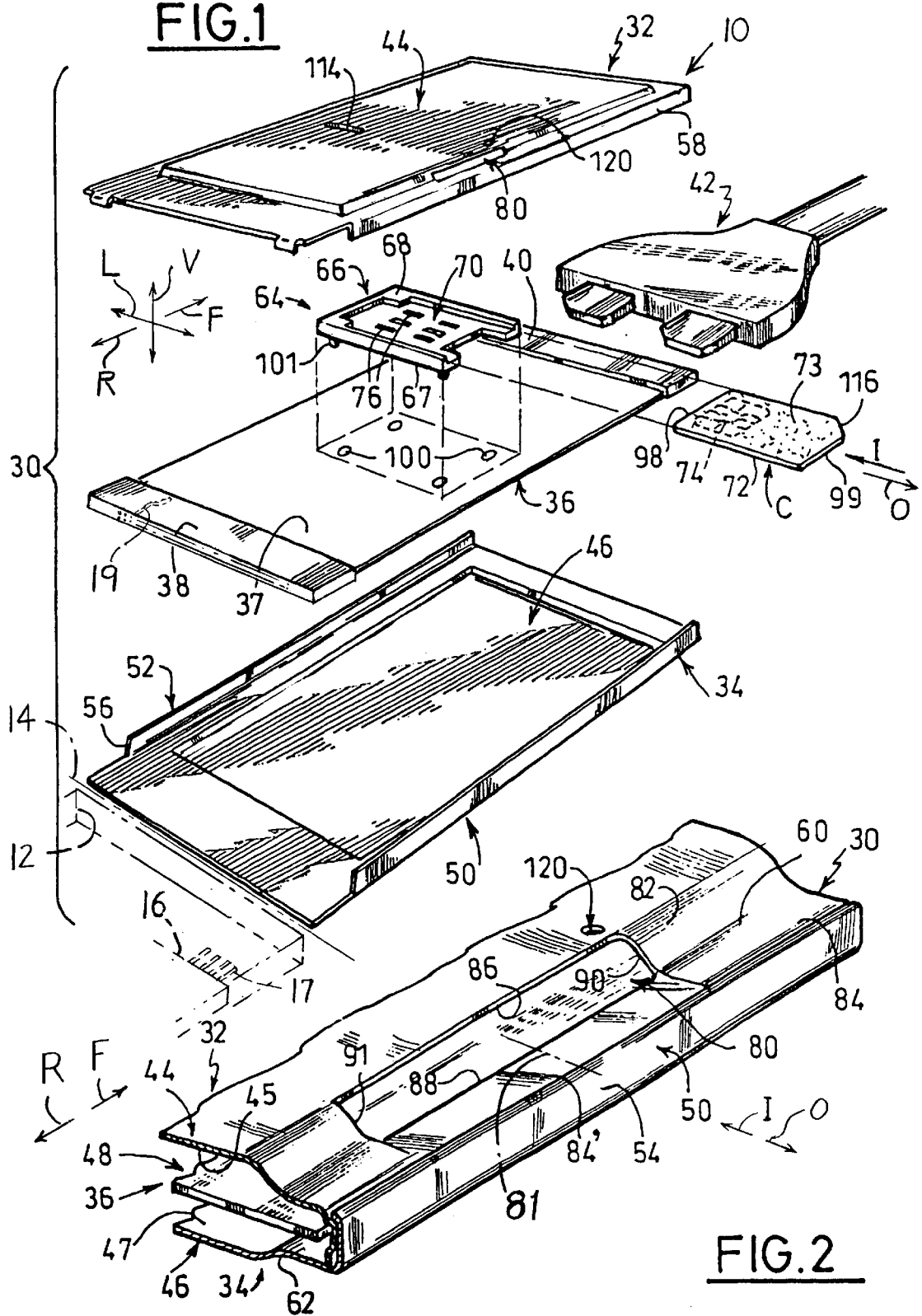

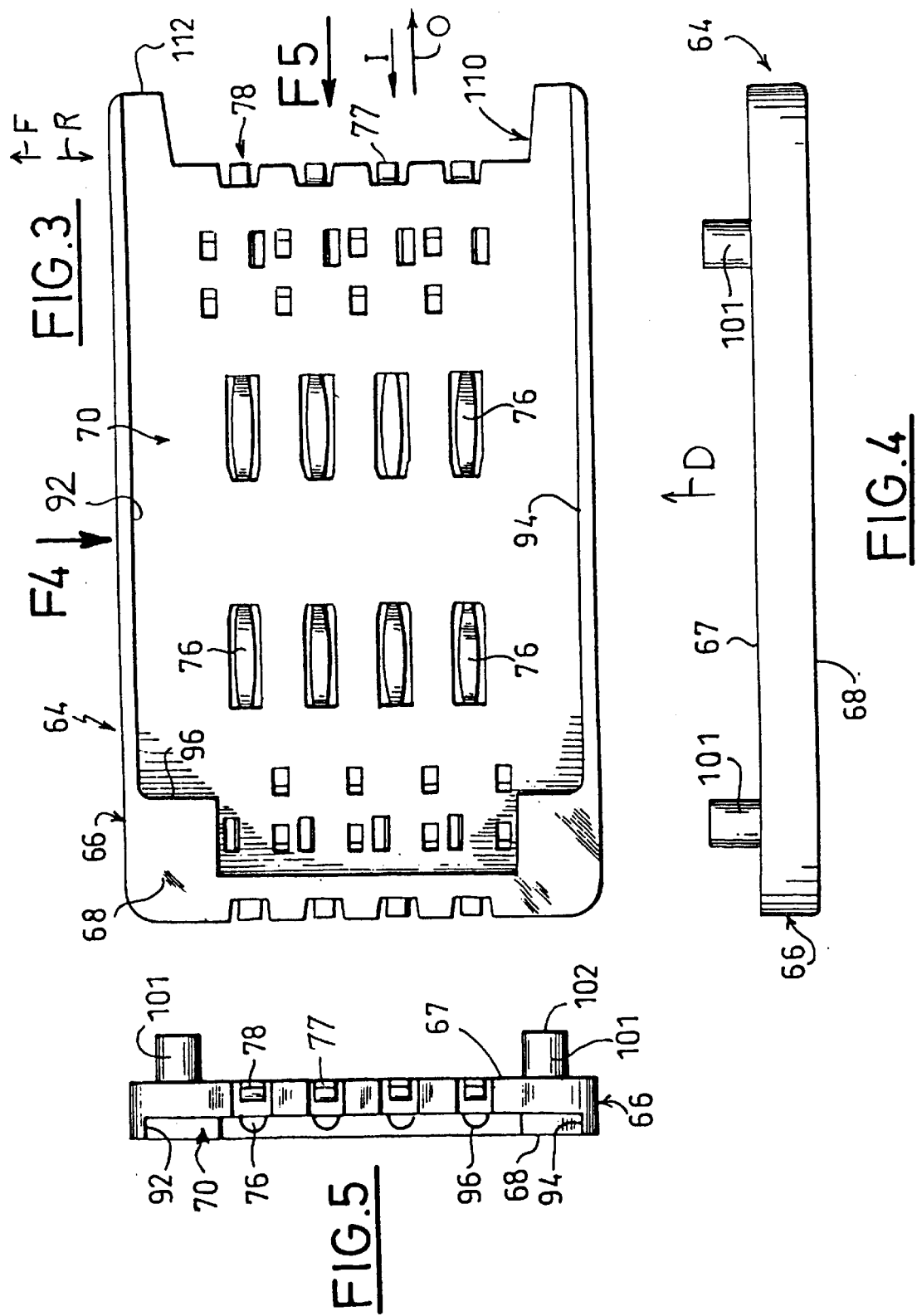

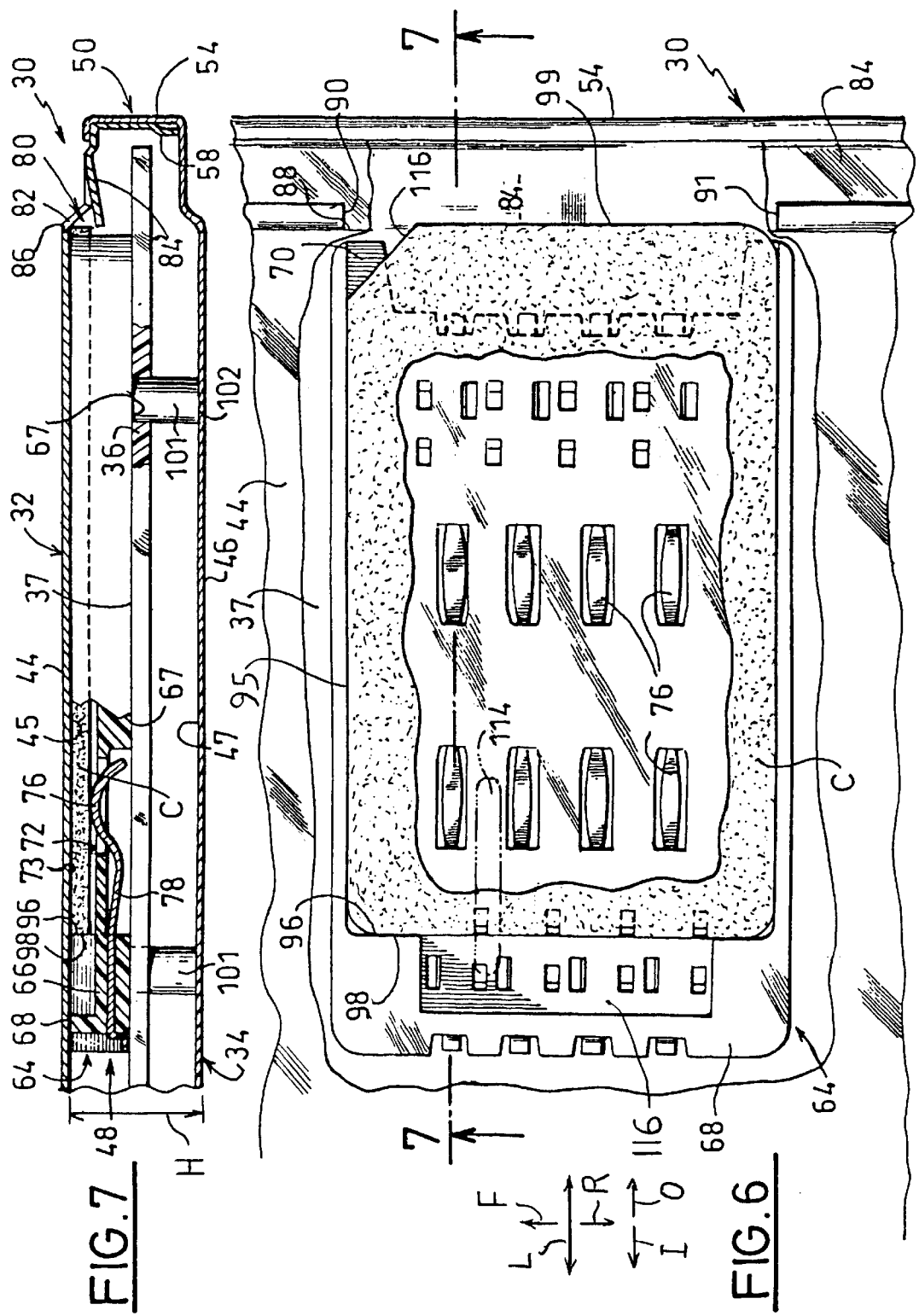

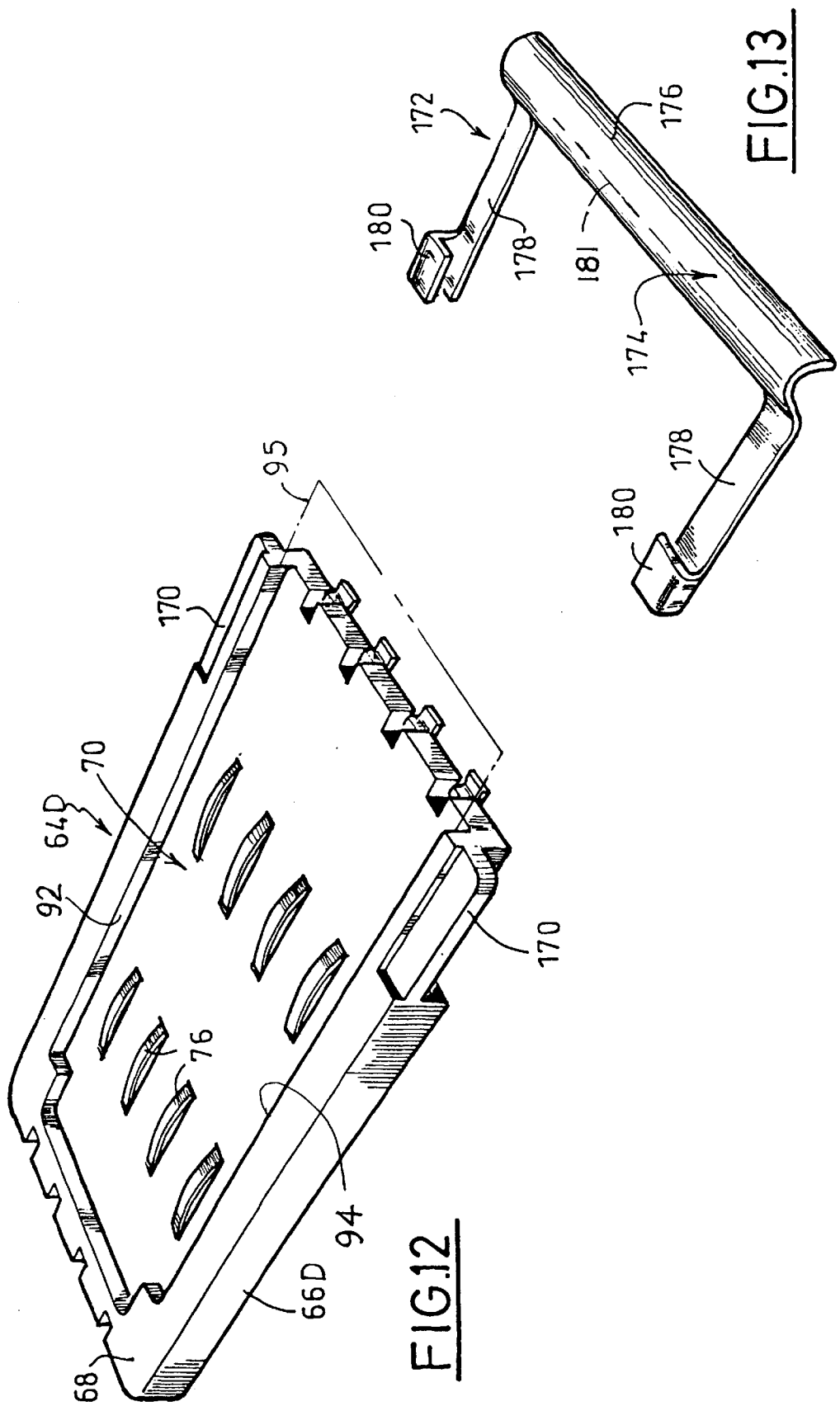

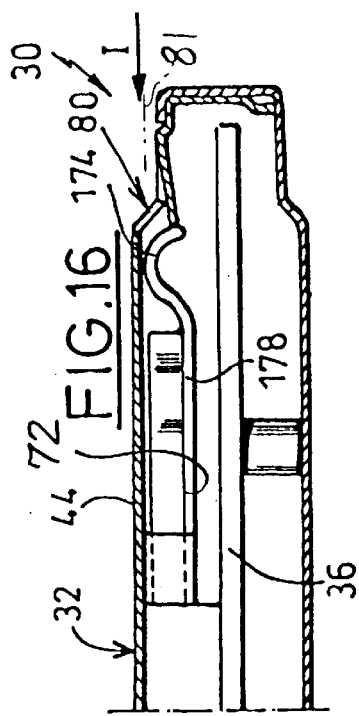
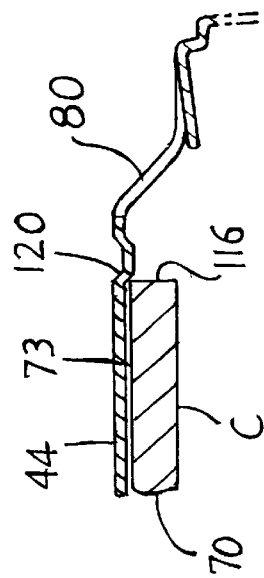
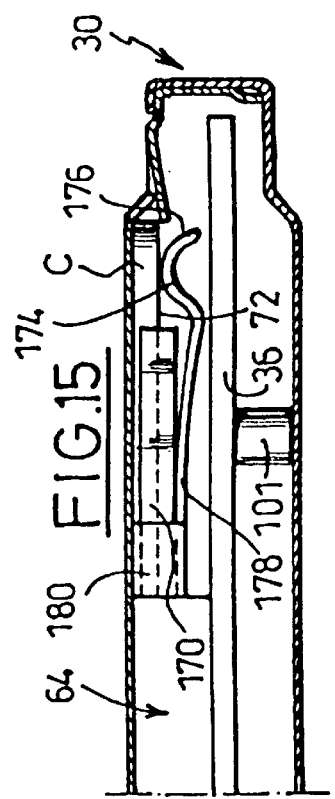
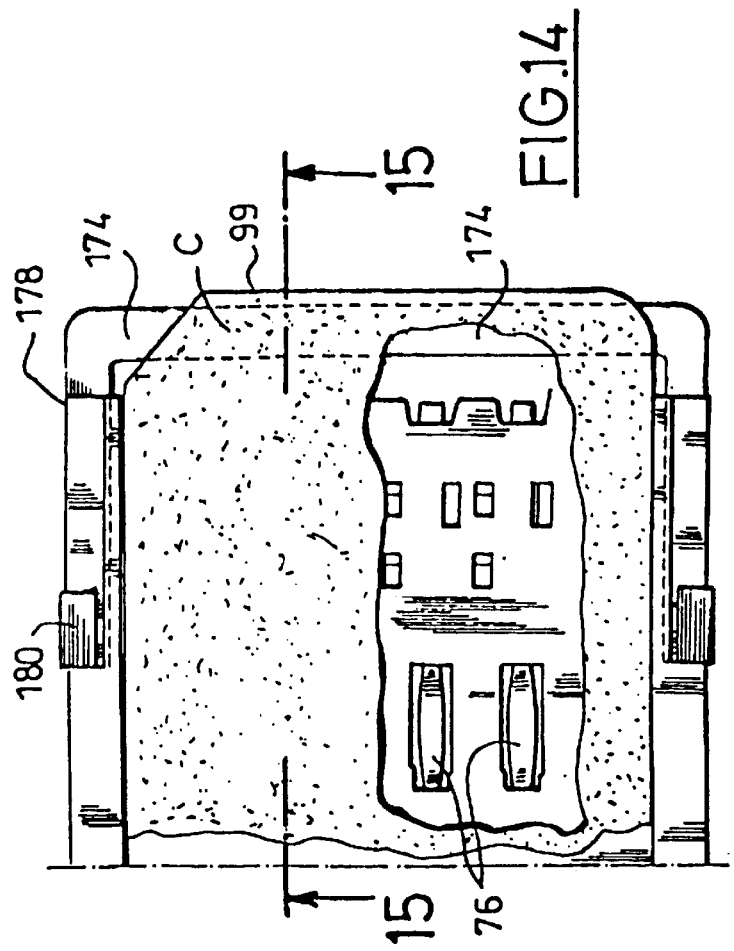

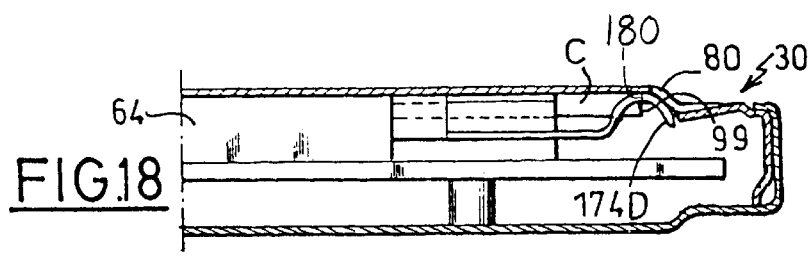
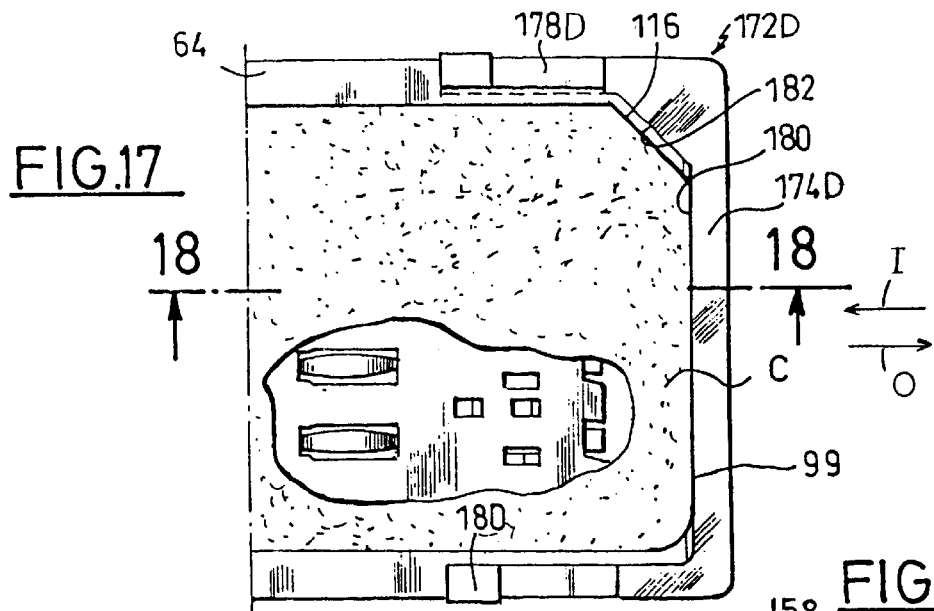
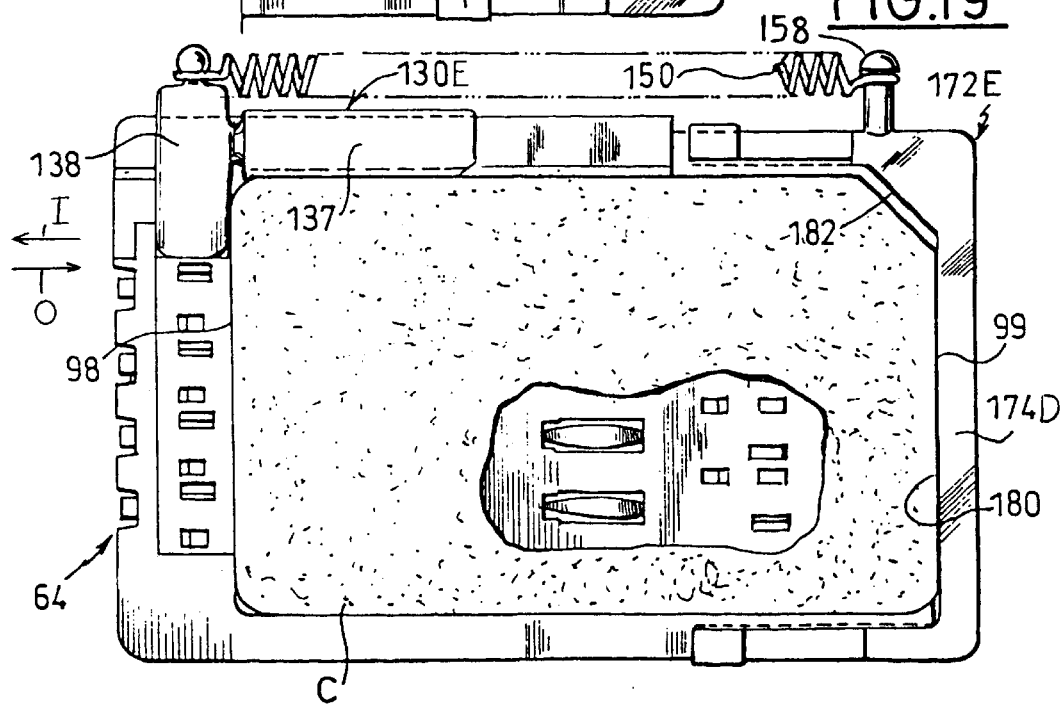

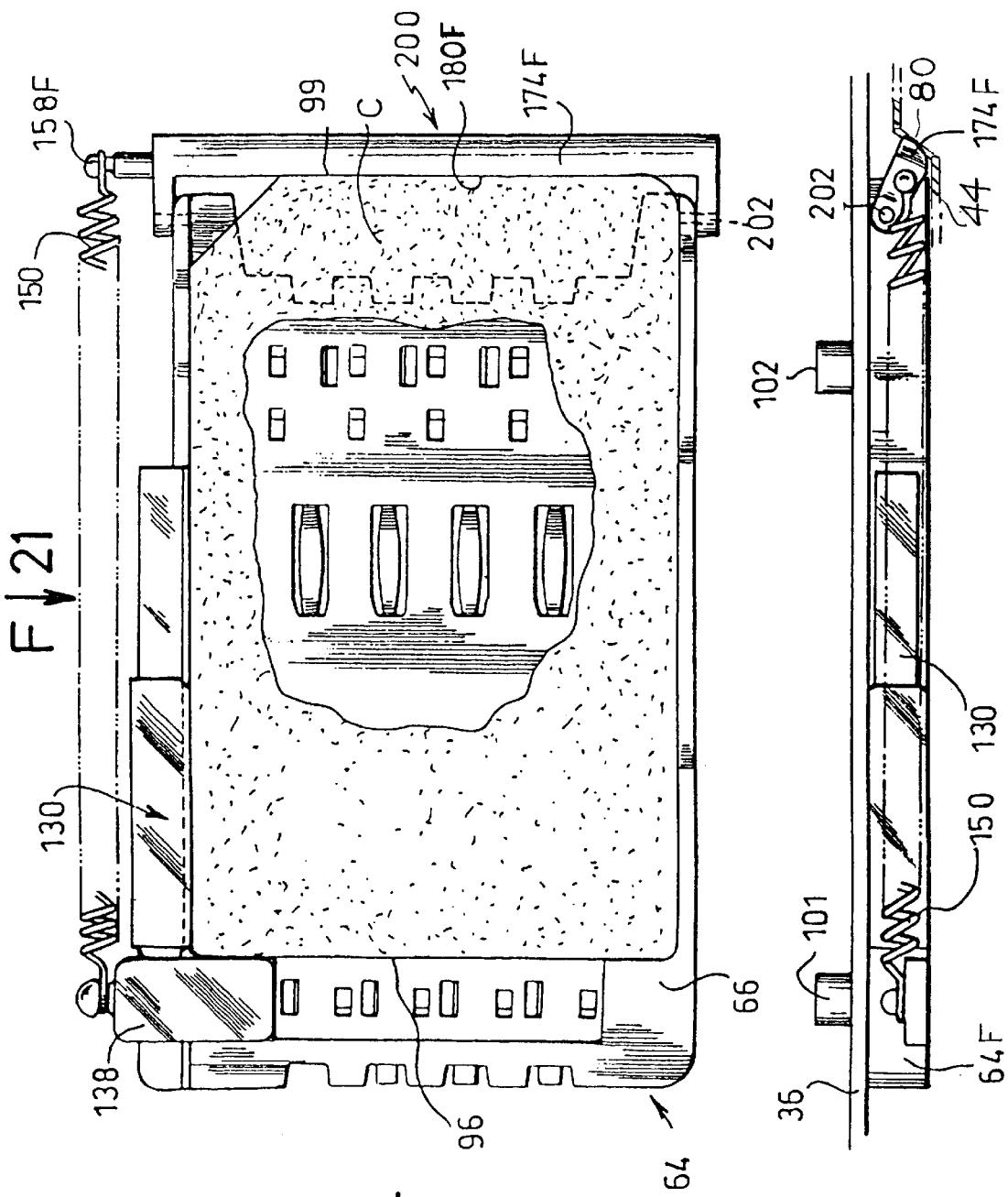

PC CARD CONNECTION UNIT FOR MICRO SIM CARD

BACKGROUND OF THE INVENTION

The present invention relates to an electronic connection unit in the form of a PC card, for connecting to a small smart card such as a Micro Sim card. The invention more particularly relates to a PCMCIA (Personal Computer Memory Card International Association) standard PC card which can be inserted into a host such as a personal computer to make one or more connections between the small smart card and the computer and/or peripherals connected to a front end of the PC card. It is noted that the PCMCIA standards relate to the external dimensions of the connection unit, in order to make it possible to insert a standard PC card into any personal computer which includes an insertion slot or passageway whose dimensions correspond to the PCMCIA standards.

The present PC card or electronic connection unit in the general form of a card, includes a metal shell made in two (possibly merging at one end) parts, with upper and lower parallel plane main walls and with side walls which, between them, form a cavity. A circuit board lies in the cavity and is spaced between the upper and lower walls. The circuit board may carry electronic components and, at its opposite longitudinal ends, PC card connectors and/or spacers. A connector at the PC card rear end can connect to a host connector lying at the rear of the host passageway. If the PC card has a PC card connector at its front end, such front connector may, for example, receive a plug for connection to a telephone line.

For some applications, such as to allow a personal computer user to access a telecommunications network, it has become necessary to be able to associate the PC card with a small smart card. Such small smart card comprises a plastic plate that is usually less than one millimeter thick, that usually has a memory that stores information, and has a group of contact pads for accessing the memory. This principle of authorizing access to a user owning a miniature or small smart card is commonly applied in the field of radiotelephony. A common smart card is a "MICRO SIM" card of standard dimensions.

It has been proposed to associate a small smart card connector with a PCMCIA connection unit, or PC card. However, designs known to date have unacceptably reduced the rigidity and the electronic screening characteristics, or EMI (electromagnetic interference) protection, of the PC card which the metal shell provides.

SUMMARY OF THE INVENTION

In accordance with one embodiment of the present invention, an electronic connection unit in the form of a PC card is provided, which allows a small smart card to be associated with it without considerably modifying the dimensional and structural (including EMI protection) characteristics of the PC card. A small smart card connector is mounted on the upper face of the circuit board that lies in the PC card. The shell of the PC card has a slot for passing the small smart card horizontally into the connector.

According to other characteristics of the invention:

The small smart card connector has an insulative connector housing with a pair of side guide edges and an inner stop for guiding a small smart card into a position where connector contacts engage contact pads on the small smart card;

The small smart card connector housing has means for positioning it on the circuit board. The connector housing includes a plurality of spacers in the form of feet that extend through the circuit board and that have lower ends lying adjacent to or abutting the shell lower main wall. The upper end of the connector lies adjacent to or abuts the shell upper main wall.

Means for extracting the card includes a notch which is formed in the upper main wall of the PC card. The notch can be elongated and extend parallel to the insertion direction. This allows a tool inserted through the notch to push the card or a carriage that holds the card, to slide the card outward. The notch can extend at least partly in line with the rear transverse edge of the fully inserted card, to allow the insertion of an extraction tool which engages the rear transverse edge of the card.

A slidable carriage can be provided that includes an inner transverse edge that abuts the inner end of the small smart card. Means accessible from outside the PC card, is provided for controlling the sliding displacement of the carriage. The carriage is spring biased outwardly toward the extraction position, but is automatically retained in the insertion position by locking means. The means for automatically locking the carriage can include a retractable locking finger which is carried by the carriage. In the card insertion position, the finger is received in a hole in the upper main wall of the unit, the finger being upwardly biased into the hole.

The means for automatically locking the carriage can include a retractable locking bar which is carried by the connector and which normally lies in a position for locking the card in the inserted position, with the bar being resiliently urged to that position.

The locking bar normally blocks the card-receiving slot, but can be moved down by the inward end of a small smart card during insertion.

Closure means are provided for at least partially closing the slot through which the small smart card is inserted. The closure means is resiliently deflectable and is automatically moved out of line with the slot when the card is inserted. The closure means is carried by the connector housing. The closure means include a closure lip which is mounted so as to move vertically with respect to the connector housing. The closure means includes a cam that interacts with the rear transverse edge of the card when the card is being inserted, in order to cause vertical movement of the lip. The lip is carried by two resiliently deflectable arms that extend along parallel sides of the connector housing. The closure lip is part of a closure seal.

The upper main wall of the PC card can include a boss which, when the card is in the inserted position, faces a portion of the outer transverse edge of the card to prevent accidental ejection of this card from the unit. The bottom of the connector housing can include a ramp which causes the outer transverse edge of the card to be raised during movement for extracting it from the unit.

BRIEF DESCRIPTION OF THE DRAWINGS

FIG. 1 is an exploded perspective view of the main components of a PC card, or connection unit of the invention.

FIG. 2A is a sectional view of a portion of the unit of FIG. 2, showing the boss thereof.

FIG. 2 is a perspective view of a portion of the unit illustrated in FIG. 1, showing the slot for inserting the small card into the PC card.

FIG. 3 is a plan view of a first embodiment of a smart card connector, intended to be installed in the connection unit of FIGS. 1 and 2.

FIG. 4 is a side view taken along arrow F4 of FIG. 3, with the connector being shown upside-down.

FIG. 5 is a side view taken along arrow F5 in FIG. 3.

FIG. 6 is a partial cut-away plan view of the connection unit of FIG. 3, which shows the connector mounted on the circuit board, in proximity to the card insertion slot.

FIG. 7 is a partially sectional view taken on line 7—7 in FIG. 6.

FIG. 8 is a partial cut-away plan view of a connector of a second embodiment of the invention which, is equipped with a first type of card extraction carriage, wherein the carriage and the card are shown in the card insertion position and are also represented in phantom lines in the partial card extraction position.

FIGS. 9 and 10 are views taken along arrows F9 and F10 respectively in FIG. 8, with the connector shown upside-down in FIG. 9.

FIG. 12 is a perspective view of a fourth embodiment of the connector which can be used in the PC card of FIGS. 1 and 2.

FIG. 13 is a perspective view of the closure device intended to be mounted on the connector of FIG. 12.

FIG. 14 is a cutaway partial plan view of the connector of the and closure device of FIGS. 12 and 13 shown assembled, with the card shown in the inserted position.

FIG. 15 is a partial sectional view taken on line 15—15 of FIG. 14.

FIG. 16 is a view similar to that of FIG. 15, but without the card.

FIG. 17 is a partial cutaway plan view of another closure device, which also fulfills the function of a device for locking the card in the position in which it is inserted into the unit.

FIG. 18 is a view taken on line 18—18 of FIG. 17.

FIG. 19 is a partial cutaway plan view of an alternative embodiment of the locking and closure device illustrated in FIG. 18, in association with an alternative embodiment of the automatic extraction carriage illustrated in FIG. 11.

FIG. 20 is a partial cutaway view of an alternative embodiment of the means for locking the card and the carriage in the card insertion position.

FIG. 21 is a view taken on line F21 of FIG. 20, with the connector shown upside-down in FIG. 21.

DESCRIPTION OF THE PREFERRED EMBODIMENTS

Figure 11:
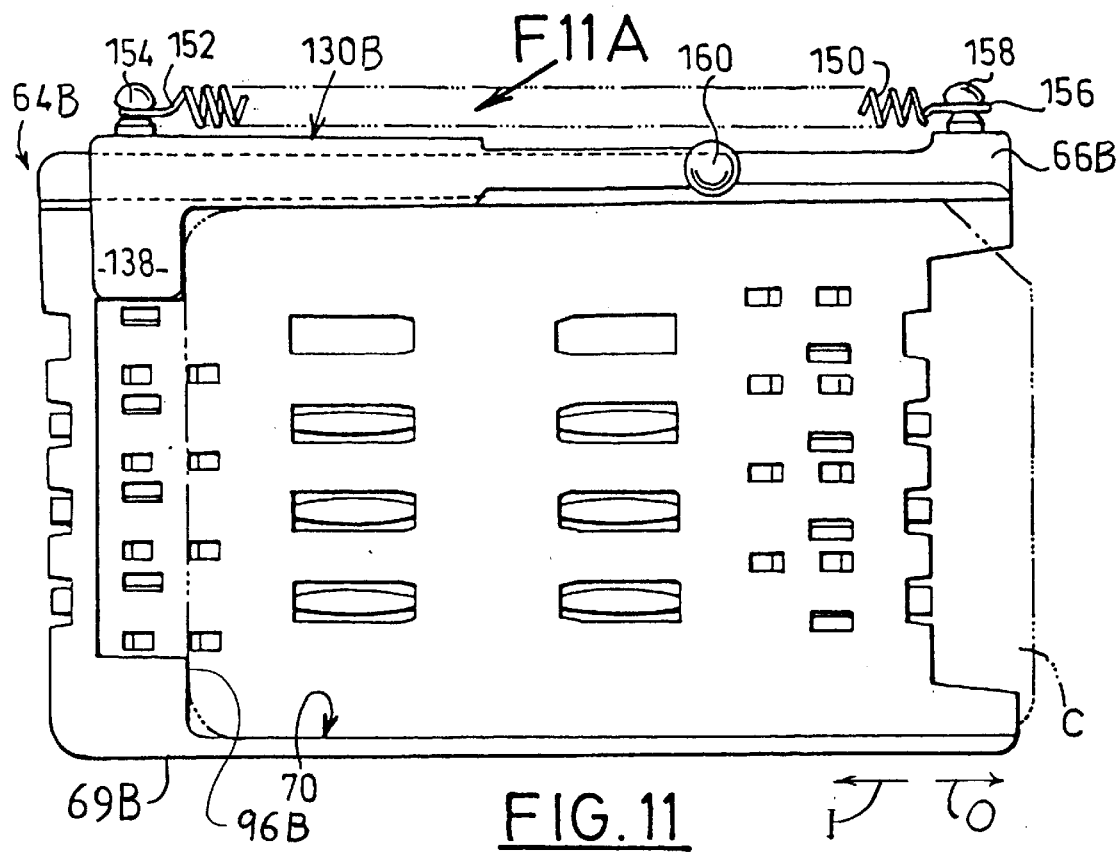
FIG. 11 is a plan view of a connector of a third embodiment of the invention, which is equipped with a second type of card extraction carriage, wherein the carriage and the card are shown in the card insertion position and are also represented in phantom lines in the partial card extraction position.

FIG. 1 illustrates a connection unit 30 in the form of a PC card, of known general design, which includes a card housing 10 comprising a sheet metal shell. The shell includes upper and lower half-shells 32, 34, each of which is a piece of cut, stamped and folded sheet metal. The shapes and the dimensions of the shell are in accordance with the PCMCIA standard for PC cards, which specifies a length in directions R, F of 85.6 mm and a width in lateral direction L of 54 mm. For a Type II card, which is the most popular type, the height in direction V is 5 mm. By providing a standard shell, the card can be inserted into a standardized passageway 12 of a host 14 which, for example, may be a passage in a personal computer. The host has a host connector 16 at the rear end of the host passageway, with host contacts 17 that can mate with PC card contacts 19 at the rear of the PC card 30.

The PC card 30 includes a circuit board 36 (which can hold circuit components) lying between the half-shells 32 and 34 and lying in a horizontal plane. The rear end of the PC card includes a rear connector 38 (shown in simplified form). The front end of the PC card is shown holding a front connector 40, though some cards have spacers thereat. In FIG. 1, the front connector 40 is designed to mate with a plug 42 which connects the PC card 30, for example, to a telecommunication line.

The upper half-shell 32 has a horizontal planar upper main wall 44 which, in cooperation with a horizontal planar lower main wall 46 of the lower half-shell 34, forms a cavity 48 (FIG. 2) between them. The circuit board 36 extends in a horizontal plane parallel to the walls 44 and 46 and usually about halfway between the opposite facing faces 45 and 47 of the walls 44 and 46.

According to the standardized design of the PC card 30, it has laterally (L) opposite sides 50 and 52, which extend parallel to front and rear F, R longitudinal directions in the PC card of FIG. 1. The lower half shell 34 has vertically-extending sidewalls 54 and 56, which are crimped around the opposite side walls of the upper half-shell. One of the upper sidewalls is illustrated at 58 in FIG. 1. The frame 10 may be produced with a one-piece shell.

The sides 50 and 52 of the connection unit or PC card 30 are in the form of rails for guiding the PC card in movement into the host passageway. To this end, the side end portions of the upper and lower half-shells 32, 34 have transition regions 60, 62 to give the sides 50 and 52 a height (e.g. 3.3 mm) which is less than the height (5 mm) at the middle of the PC card, where it is thickest. Each transition region such as the upper one 60 includes an inclined surface 82 which extends at an angle of more than 15° and up to 90° (or even slightly more) from the horizontal, and a primarily horizontal surface 84.

In accordance with the present invention, a connector 64 is provided that is intended to receive a small smart card C with integrated circuit(s) of the "MICRO SIM" type, the connector lying within the PC card 30. The "MICRO SIM" card C may be referred to as a small smart card because it has a surface with contact pads (in zone 74 of its lower face 72) that provide electrical access to circuitry (usually primarily a memory chip) embedded in the rest of the smart card. The small card has a length, width, and thickness that are much less (less than 98% and usually less than 50%) of corresponding dimensions of the PCMCIA type 11 card. A "MICRO SIM" card has a length, width and thickness much less than 50% of the corresponding standard PC card dimensions (54 mm×85.6 mm, with a thickness of 3.3 mm, 5 mm, and 10.5 mm, respectively, for type I, II, and III cards).

According to a known design which is, for example, described and represented in French Patent Application No. 95.14767, the connector 64 includes a connector housing 66 of insulating material, with an upper face 68. The support forms a card-receiving recess 70 whose shape is complementary with that of the card C, and which can receive at least part of the card. When the card C is in a fully inserted position in the recess 70, the contact pads at 74 engage contacting ends 76 of contacts 78 of the connector. A plurality of the contact pads 74 may be connected, through contacts 78, to PC card contacts 19 at the rear of the PC card. The connector 66 of FIG. 1 is intended to be mounted with the lower face 67 of the connector housing 66 lying against the upper face 37 of the circuit board 36.

When the PC card 30 is assembled and closed with the connector 64 carried by the circuit board 36, the PC card can receive a small smart card C. The PC card housing frame 10 is formed with a slot 80 to allow insertion or extraction of the card C into or from the connector. The slot 80 is preferably located in or near one of the sides 50 of the PC card. As shown in FIG. 2., the insertion slot 80 is formed primarily in the inclined surface or part 82 of the side or transition region 60 of the upper half-shell 32. As discussed above, the transition region joins the upper main wall 44 to the horizontal surface part 84 where the PC card has a reduced-thickness side portion.

The area 84' of the horizontal part 84, which extends in line with the bottom of the slot 80 in the inclined portion 82, is slightly angled downwardly and inwardly, at an angle of about 10°, with respect to the horizontal plane of the plane portion 84. The insertion slot 80 has vertically spaced upper and lower main edges 86, and 88 and has two end edges 90, 91. A horizontal slot axis 81 passes laterally through the middle of the slot.

In the preferred design of the slot 80 shown in FIG. 2, the slot does not extend into the main upper wall 44. The slot width, measured in the general longitudinal direction (R, F) of the PC card, is slightly greater than the width of the card C, so as to allow insertion and extraction of the latter in inward and outward directions I, O, which are transverse to the general longitudinal direction (R, F) of the PC card.

As shown in FIGS. 3 to 5, the recess 70 of the connector 64 has opposite edges 92 and 94 which extend parallel to the insertion direction I, and has an inner or inward edge 96 that extends perpendicular to the insertion direction. When the card C is fully installed in the card-holding recess 70, the inner edge 96 constitutes a stop for the rear transverse edge 98 (FIG. 6) of the card C. The card has opposite card edges 95 (FIG. 6) that are engaged by the recess edges.

At its outer end, on the right in FIG. 3, the connector housing 66 is open so as to allow insertion and extraction of the card C into and from the connector housing 66 by sliding it in the directions I, O parallel to the general horizontal plane of the card C. The height of the recess 70 is slightly greater than the thickness of the card C.

The connector 64 has four feet 101 projecting downwardly D from the board-engaged face 67 of the connector housing 66. The feet 101 are in the form of cylindrical studs. The feet 101 position and fix the connector 64 on the circuit board 36. The circuit board has holes 100 (FIG. 1) through which the feet extend and which closely surround the holes to prevent horizontal movement of the connector. The feet 101 also serve a spacer function between the upper and lower main frame walls 46, 48 of the PC card 30, to prevent accidental crushing of the PC card.

As can be seen in FIG. 7, the height of the feet 101, is such that the lower end face 102 of each foot is in contact with the upper face 47 of the lower main wall 46, while the planar upper face 68 of the connector insulating support or connector housing 66 bears against the opposite lower face 45 of the upper main wall 44. For a type II PCMCIA card, which is illustrated, the height of the card middle portion is 5 mm. The sheet metal upper and lower main walls 44, 46 each have a thickness of about 0.2 mm, so the distance H between the shell main walls is about 4.6 mm, or between 4 and 5 mm for type II PCMCIA card. For all PCMCIA cards, the height H equals the height between the upper and lower horizontal main walls.

As can be seen in FIG. 3, the connector 64 has a recess or cutout 11 0 in its outer edge 1 12. The outer edge 112 is positioned on the circuit board 36, so the contact connection ends 77 (FIG. 5) which are soldered to circuit board traces, lie below an inward extension of the slot 80 in the PC card shell. This avoids an accidental short-circuit of the connection ends 77 of the contacts 78 by contact pads of the card.

As can also be seen in FIGS. 6 and 7, when the small smart card C is fully inserted into the PC card so the smart card contact pads engage the contact ends 76, the outer edge 99 of the card is located entirely within the PC card 30. Actually, the outer edge 99 is slightly set-back from the upper slot edge 86 (FIG. 7) of the insertion slot 80. In order to facilitate full insertion of the card, an additional cut-out may be provided in the edge of the slot 80. The PC card 30 thus has an outside "silhouette", after insertion of the card C, which is identical to that of a standard PC card, so as to allow it to be inserted into a corresponding slot of a personal computer.

The insertion slot 80 has small dimensions, with a height of about 0.8 mm and a longitudinal (R, F) length of about 15 mm and a lateral (L) length of about 25 mm. The small slot does not greatly affect the rigidity of the PC card or the EMI (electromagnetic interference) blocking function of the shell.

In order to allow extraction of the small smart card C of FIGS. 1–7 from the PC card 30, a notch or extraction groove 114 (FIG. 1) is provided in the upper main wall 44 of the shell. The notch 114 is shown by a phantom line in FIG. 6. The notch extends laterally (L) with respect to the PC card 30, i.e. parallel to the insertion and or extraction directions. The notch 114 extends both inward (I) and outward (0) of the rear or inner transverse edge 98 of the card C and, preferably, opposite a region of the connector 64 which does not include parts of the contacts 78. The notch extends to an outward portion 116 of the card housing recess so a tool can abut the inner edge of the fully inserted card.

The notch 114 provides a passage for the insertion of a small tool (e.g. a toothpick) to push on the inner edge 98 of the card C to push it out from the connector housing recess 70. The notch is long enough to cause the outer edge 99 of the small smart card to project considerably from the PC card through the slot 80. The projection (of a plurality of millimeters) is sufficient to allow the user to grasp the card to extract it fully from the PC card.

According to the standardized definition of "MICRO SIM" cards, an example of which is illustrated in FIG. 6, the card C has a cut-out flat 116 at an outside of its outer edge 99. For some applications the cutout constitutes an orienting means for positioning the card C in a connector.

In order to hold the small smart card C in the fully inserted position in the PC card 30, the upper main wall 44 of the PC card shell may be formed with a depression, or boss 120 (FIGS. 1,2 and 2A). As shown in FIG. 6, the boss 120 projects slightly into the card-holding recess 70 to form a stop which lies outward of the card flat cutout 116. As a result of the boss 120, a slightly greater outward force must be applied to the inner end of the card to extract it. The slightly greater effort, is required to resiliently deflect the upper main wall 44 of the PC card upwardly. The boss 120 rises as the cut-out flat 116 and then the upper face 73 of the card passes by.

Figures 8, 9, 10:
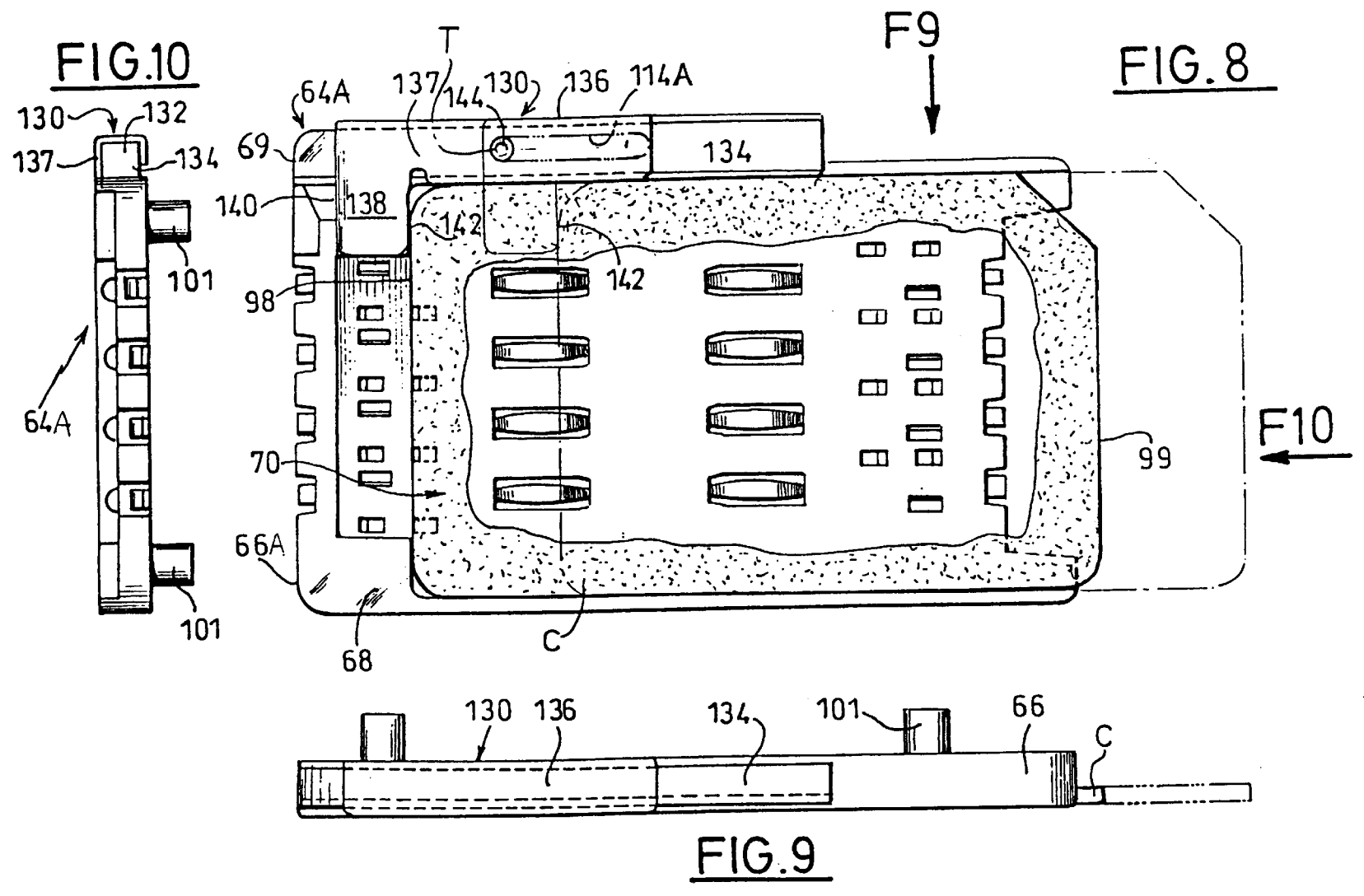

FIGS. 8 to 10 show a connector 64A whose connector housing includes a stationary body 69 and a carriage 130 for manual extraction of the small smart card C. The insulative body includes, on one of its side edges 132, a slideway 134 on which a carriage side portion 136 is slidably mounted. An extraction tab 138 of the carriage has an outer edge 142 for abutting the card, and has an inner edge 140 that abuts an inner transverse edge of the housing body 69 in the full insertion position of the card. When the extraction carriage 130 slides from its card insertion position to a card extraction position, its tab 138 causes outward displacement of the card C.

The side 136 of the extraction carriage 130 includes a hollow 144 intended to receive the narrow end of a tool (e.g. a toothpick). Such tool is inserted into a notch 114A in the upper face 44 of the PC card. The notch 114A is similar to the notch 114 of FIG. 6, except that notch 114A extends from the location of hollow 144 and outwardly therefrom by several millimeters. This design is advantageous because the extraction tool T does not have to push directly against the inward edge 98 of the card C, thus preventing damage to the card. The slide upper face, in the form of a plate 137 of the sheet metal slide 130, extends around (and immediately below) the notch 114, in the upper main wall of the PC card, thus ensuring electromagnetic closure of the notch 114.

The embodiment illustrated in FIGS. 11 and 11A will now be described, in which the connector 64B is equipped with a card extraction carriage 130B that has a stop surface 96B and that automatically extracts the card. The extraction carriage 130B is similar to the one in FIGS. 8 to 10, but is equipped with a tension coil spring 150 which urges the carriage outward. A first or inner end 152 of the spring is hooked on a lug 154 of the slide 130, while its opposite outer end 156 is hooked on a lug 158 formed on the stationary portion 69B of the connector. The spring 150 continuously urges the card C to retract from the PC card. In order to hold the card in the inserted position, illustrated in phantom lines in FIG. 11, a means is provided for locking the extraction carriage 130 in the card insertion, or inward position. The locking means is formed by locking finger 160 which, in the card insertion position of the carriage, is received in a complementary hole 162 in the upper main wall 44 of the PC card.

The finger 160 can be formed by a boss or a ball fixed to the end of an arm 166 which extends from the extraction carriage 130 or can be a bent end of the arm. The bar or arm 166 can be bent down by its resilient deflection (or by a pivot joint and spring) to release the locking finger 160 from the hole 162, using a person's fingernail or a tool to depress the finger. The carriage and card then automatically slide outward, with the finger 160 rubbing against the lower face 45 of the upper main wall 44 of the PC card.

The automatic extraction carriage 130B that is moved outward by the extraction spring 150, makes it possible to do without the notch 114 in the unit 30, and to replace it by a simple small hole 162. The hole 162 is closed either by the locking finger 160, or by a portion of the upper face 167 of the arm 166, during outward extraction travel of the carriage 130B.

It is desirable to at least partially close the insertion slot 80 to keep out dirt and EMI. FIGS. 12 to 16 show an insulative connector housing 66D that is modified to include a slot closure device. FIG. 12 shows a connector housing 66D with edge guides 92, 94 defining a horizontal guide plane 95 between them. The connector housing forms two longitudinally opposite ribs 170 for supporting the closure device 172 of FIG. 13. The closure device 172, which is preferably formed of sheet metal includes a closure lip 174 of a generally hollow semi cylindrical shape. The lip has a convex upper face 176 that faces primarily upwards and that lies inward of and in line with the slot 80 (i.e. in line with a horizontal axis 81 of the slot). The closure lip 174 is mounted on the outer ends of two parallel arms 178. Each arm carries a U-shaped tab 180 at its inner end for attaching the closure device to the connector 164 by inserting the ribs 170 into the attachment tabs.

As shown in FIGS. 14 to 16, the arms 178 which carry the closure lip 174, extend outwardly from the bottom of the ribs 170. By being flexed vertically, the arms allow primarily vertical displacement of the lip 174. In a normal rest position illustrated in FIG. 16, which the closure device assumes in the absence of a card, the lip 174 lies inward of the slot 80 in the PC card. It is noted that in FIG. 16 the slot 80 extends slightly into the PC card by projecting slightly into the upper main wall 44.

The closure lip 174 retracts by moving down automatically when the card C is inserted in the direction I. This is because during card insertion the rear transverse edge 98 of the card C presses against the closure upper face 176 which acts as a cam to cause bending of the arms 178 and downward movement of the closure lip. While the card is slid inwardly, the lip 174 presses up against the lower face 72 of the card.

In the embodiment of FIGS. 17 and 18, the closure device 172D also constitutes a device for retaining the card C in its fully inserted position. To this end, the arms 178D are slightly longer and the lip 174D includes a rear barrier 180 with a part at 182 which is complementary to the cutout flat 116 at the outer edge 99 of the card.

When the card is in the inserted position, the rear barrier 180 faces the outer front edge 99 of the card C. The barrier then prevents extraction of the card and therefore locks the card C in the inserted position and avoids accidental extraction of the card. FIG. 13 shows the shape of the barrier at 181 in phantom lines. To extract the card, manually or automatically, it is necessary to push down the lip 174D (FIG. 18) until it lies below the plane of the card C. The card then can slide outwardly through the opening 80 although the card must be pushed out.

Figure 11A:
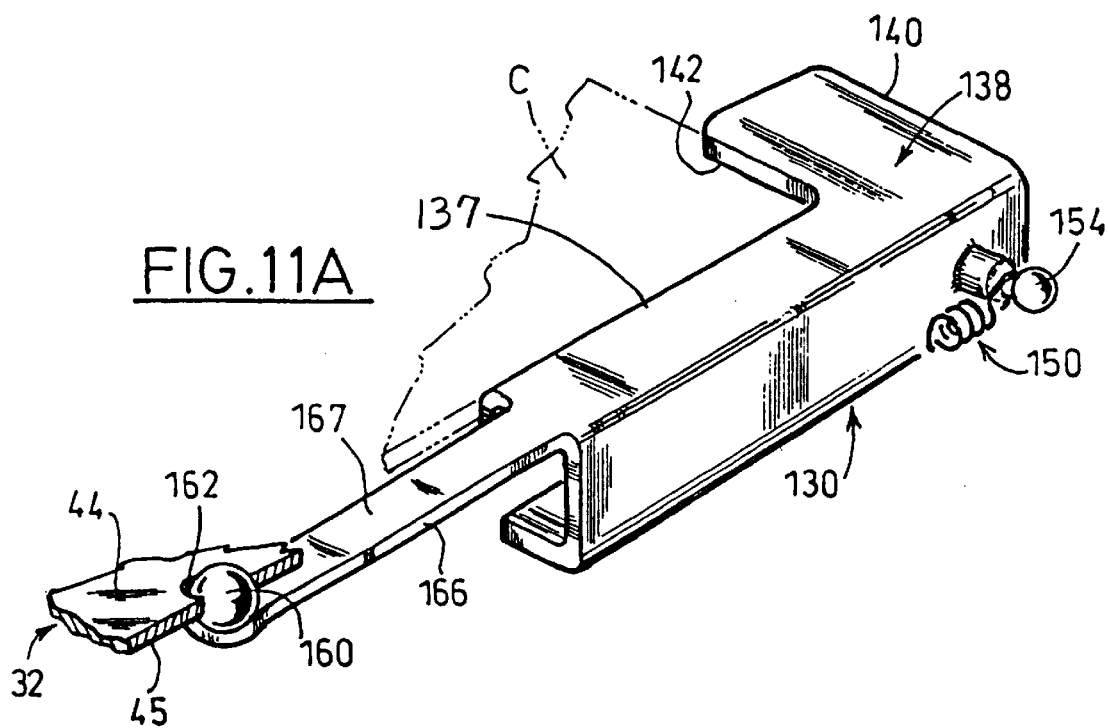
FIG. 11A is a perspective view taken along arrow F11A in FIG. 11, which illustrates the design of the extraction carriage on a larger scale.

In the alternative embodiment illustrated in FIG. 19, the closure device 172E is similar to the one illustrated in FIGS. 17 and 18, but is associated with an extraction carriage 130 of the type described in FIGS. 11 and 11A, with a spring 150. A lug 158 for attaching the extraction spring 150 can be formed integrally with the closure device 172E. This enables simplification of the extraction carriage 130 because it does not require its own means for locking the card in the inserted position, locking being ensured by the closure device 172E. The card is continuously urged outwardly by the extraction carriage 130E so the card outer edge 99 abuts against the edge of the outer barrier 180 of the lip 174D. To cause automatic extraction of the card C, it is sufficient to downwardly deflect the lip 174 through the slot 80. Once the lip barrier 180 (also indicated in FIG. 13) moves below the outer edge of the card, the card is automatically moved outward by the extraction carriage 130.

In the embodiment illustrated in FIGS. 20 and 21, the device for locking the card consists of a rocker bar 200 which is mounted so as to pivot on the housing of the connector 64F about a pin 202. The extraction spring 150 is hooked on a lug 158F which is carried by the rocker bar 200 so as to urge the latter continuously into the card locking position. In the locking position the outer barrier 180F of the rocker bar 200 lie outward of the outer edge 99 of the card when the latter is in the inserted position, as is illustrated in FIG. 20. If the outer end of the rocker bar is depressed, the carriage pushes out the card. It is noted that the connector is shown "upside-down" in FIG. 21, in that the feet 101,102 for mounting on a circuit board project upwardly.

The upper face 174F of the rocker bar 200 fulfills a function equivalent to that of the closure lip 174, insofar as it can extend in line with the slot 80 to seal the slot and prevent card extraction.

Figure 23:
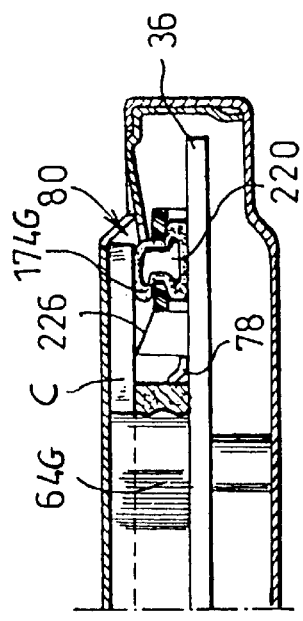
FIG. 23 is a view similar to that of FIG. 22, which illustrates the closure seal when the card is in the full insertion position.
Figure 22:
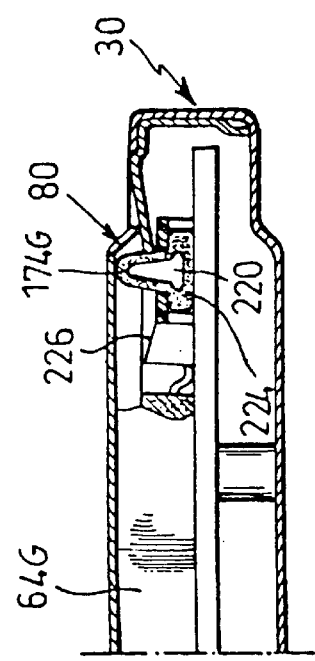
FIG. 22 is a sectional side view of another embodiment of a slot closure means, in the form of a flexible closure seal.
Figure 24:
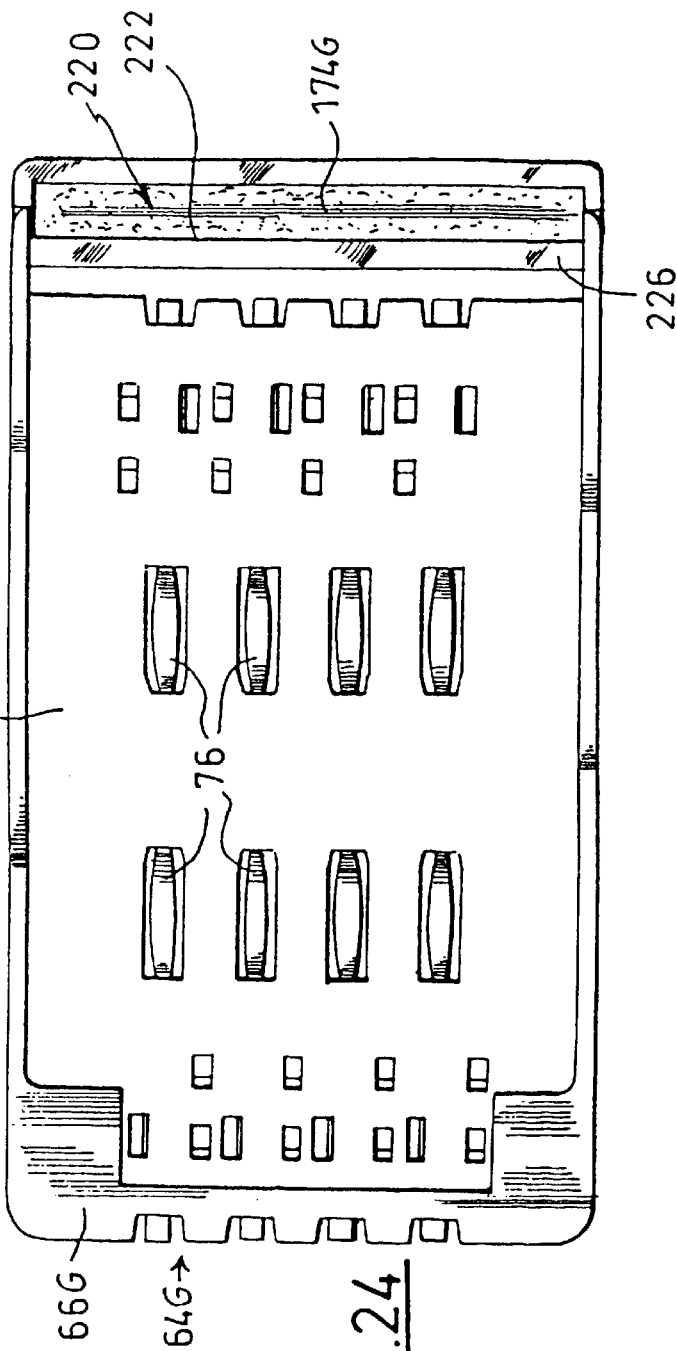
FIG. 24 is a plan view of the connector of FIGS. 22 and 23, which illustrates the arrangement of the closure seal in the front part of the connector.

FIGS. 22 to 24 illustrate another design of the means for closing the slot 80, comprising of a closure seal 220. The closure seal lies in a connector housing portion 222 formed in the connector housing 66G of the connector 64G near the outer edge of the connector. The closure seal 220 has a sealing lip 174G which normally lies closely inward of the insertion slot 80, that is when there is no small smart card in the PC card 30. The closure seal is retracted by resilient deformation when a card C is inserted into the PC card 30 through the slot 80, as is illustrated in FIG. 23. The closure seal 220 has a base 224 mounted on the connector housing part 222. A ramp 226 is provided in the connector housing 64G to facilitate insertion of the card, that is, to bring it level with the bottom of the connector housing.

Figure 27:
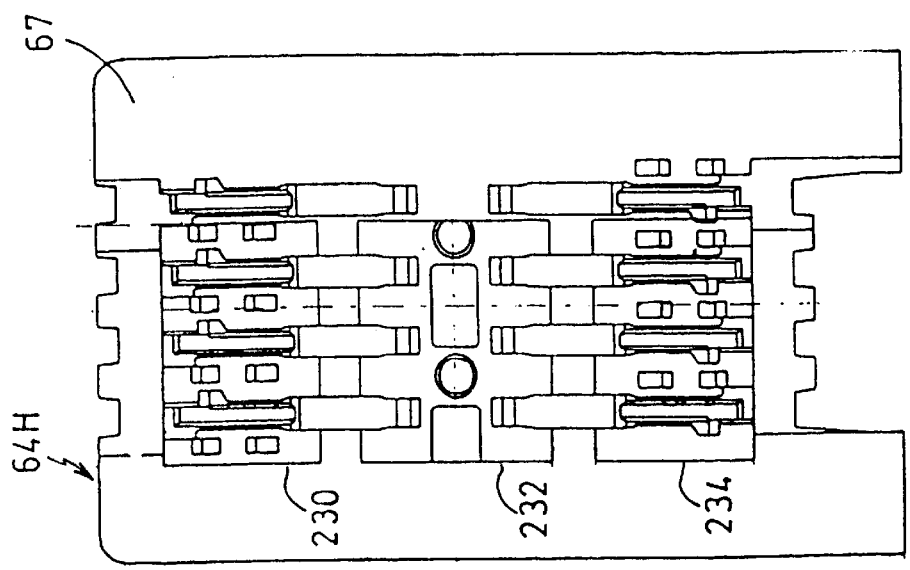
FIG. 27 is a bottom view of the connector of FIG. 25.
Figure 26:
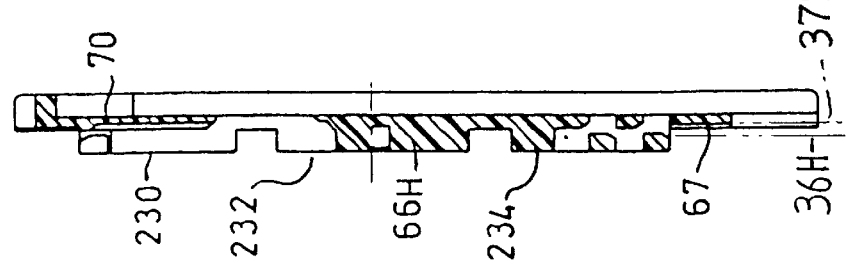
FIG. 26 is a view taken on line 26—26 of FIG. 25.
Figure 25:
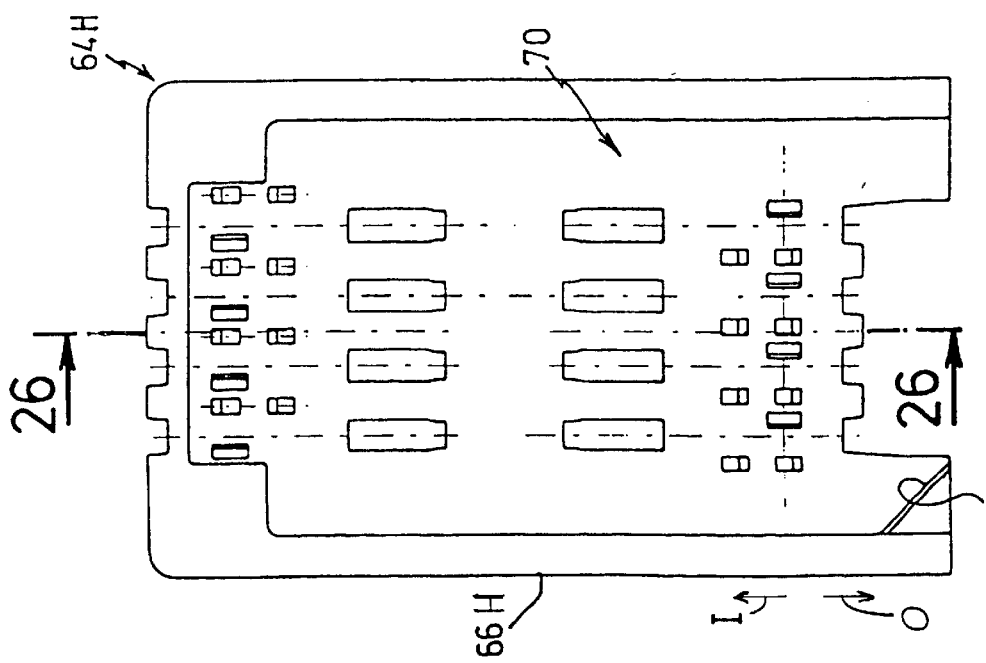
FIG. 25 is a plan view of a connector of another embodiment of the invention.
Figure 29:
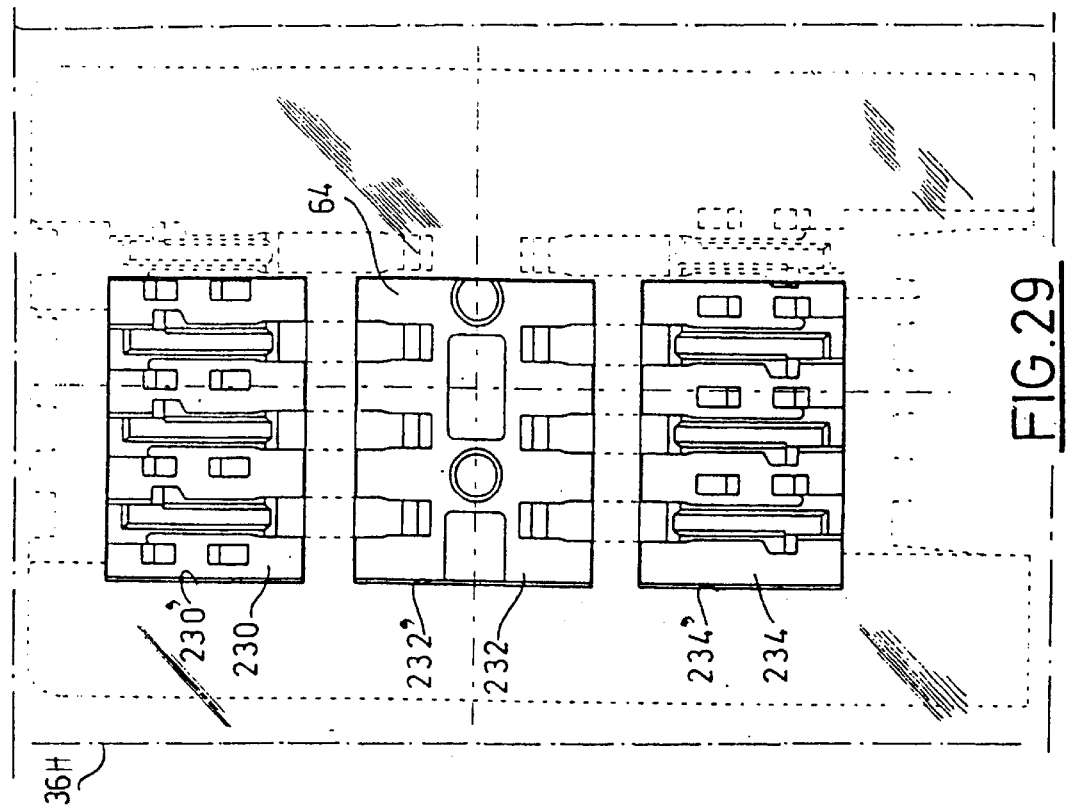
FIG. 29 is a bottom view of the circuit board of FIG. 28, with the connector in place on the circuit board.
Figure 28:
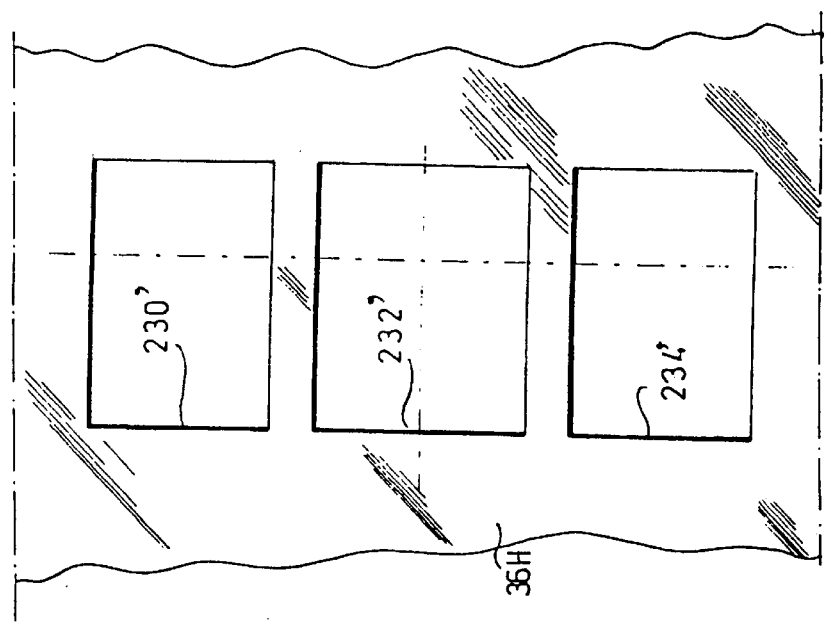
FIG. 28 is a plan view of a circuit board showing cut-outs therein for receiving the connector illustrated in FIGS. 25 to 27.

FIGS. 25 to 27 illustrate another connector housing which is intended to be mounted in association with a printed-circuit board 36H that is illustrated partially in FIGS. 28 and 29. In FIGS. 25–27, the connector 64H has an upper part intended to extend below the upper face 37 of the circuit board 36H, the thickness of which is preferably less than in the earlier embodiments described above. To this end, a part of the connector housing has a lower face 67 which bears on the upper face 37 of the circuit board 36, and has a lower housing part that extends below the connector housing lower face 67. The lower part comprises three blocks 230, 232 and 234, of rectangular contour, each of which is intended to extend into a complementarily shaped opening 230', 232', 234', respectively, formed in the circuit board 36H.

The end blocks 230 and 234 fix the positions of the contacts, while the central block 232 allows the deflectable contact parts to move down.

By virtue of a design of this type, parts of the connector 64H other than its feet may project from one or both faces of the circuit board 36. The connector 64 is positioned, with respect to the circuit board 36, by the blocks 230, 232 and 234. For the spacer function, one or more of the blocks may include feet forming spacers.

In the vicinity of the connector housing outer edge, the bottom of the connector housing includes a ramp 236 which makes it possible to raise the card when it is being extracted. The ramp 236 directs the card through the slot 80 and in a path to clear a thin step which is constituted by a stop for retaining the card in the connector and which is adjacent to the ramp. In this case, the boss (120 in FIG. 2) is superfluous.

As a variant, the slot 80 may be arranged with the insertion/extraction directions I, O parallel to the general longitudinal direction (R, F) of the PC card, and a slot for passing a small smart card may lie at the front end of the PC card in a spacer thereat.

If means for closing the slot 80 are not provided, it is observed that dust which enters the unit is confined in the connector housing 66 and cannot extend inside the PC card.

While terms such as "upper" and "lower" have been used to describe the invention as it is generally illustrated, it should be understood that the PC card electronic convention unit can be used in any orientation with respect to the Earth.

What is claimed is:

1. A PC card for installation in a host passageway that has a rear, where the PC card has a rear end connector for connecting to a host connector lying at the rear of the passageway, where the PC card can receive a small smart card which is smaller in width, length and height than the PC card and where the smart card has a surface with contact pads thereon and has opposite edges, wherein said PC card includes a PC card housing that comprises a conductive shell having upper and lower main walls and opposite sides and rearward and forward ends and a cavity therewithin, and said PC card includes a circuit board lying in a substantially horizontal plane in said cavity, comprising:

a small-card connector mounted on said circuit board and having edge guides for guiding said opposite edges of the small smart card during insertion of said small smart card into a fully installed position in said connector, said connector having contacts for engaging the contact pads of said small smart card in the fully installed position of said small smart card;

said PC card housing has a slot aligned with said edge guides of said connector, for passing the small smart card into the PC card and into said connector.

2. The PC card described in claim 1 wherein:

said circuit board has a plurality of feet-passing holes said connector has an upper surface which lies adjacent to said upper main wall of said PC card housing to support said upper main wall against downward deflection, and said connector has a plurality of feet that each passes through one of said circuit board holes and that has a lower foot end that lies adjacent to said lower main wall to support said lower main wall against upward deflection.

3. The PC card described in claim 1 wherein:

said upper and lower main walls of said PC card housing are spaced by a first distance H, said opposite sides each have a height that is less than said first distance, and said PC card housing includes upper transition regions that each extends between one of said sides and said upper main wall;

a first of said upper transition regions has an inclined surface, and said slot is formed in said inclined surface.

4. The PC card described in claim 1 including:

means for extracting one of said small cards from said slot, including a hole in said upper main wall.

5. The PC card described in claim 4 wherein:

said guides are positioned to guide a card moving in an inward direction into said slot and in an outward direction out of said slot, and said connector has a stop surface for abutting an inward end of said smart card;

said hole is elongated in a direction primarily parallel to said inward and outward directions, and said hole has a rear end positioned immediately inward of said stop surface to enable a tool inserted through said hole to push against the inward end of said smart card.

6. The PC card described in claim 4 wherein:

said connector has a carriage that is slidable in inward and outward directions and that forms a stop surface positioned to engage an inward end of a card so the card can push the carriage inwardly, and said hole is elongated in said outward direction and lies over said slide to enable a tool inserted through said hole to move said slide outwardly.

7. The PC card described in claim 4 wherein:

said connector includes a carriage that is slidable in inward and outward directions and that forms a stop surface positioned to engage an inward end of a card and being pushable inwardly by a card;

said connector has a spring that urges said carriage outwardly;

said connector has an arm with a finger that is biased upwardly into said hole, with said carriage latched in an inward position but being unlatched when said finger is moved downwardly out of said hole.

8. The PC card described in claim 7 wherein:

said hole extends completely through said upper main wall, so a finger or tool lying over said upper main wall can push down said finger.

9. The PC card described in claim 1 including:

cover means for blocking the outward end of said slot, said cover means being deflectable to open said slot to receive a small smart card.

10. The PC card described in claim 9 wherein:

said cover means is mounted on said connector, whereby all accessory portions mount on the circuit board.

11. The PC card described in claim 1 including:

a cover that has a mount portion mounted on said PC card housing and that has a closure part which is held by said mount portion, said cover being biased to a position wherein said closure part lies in line with said slot to block said slot and to receive a force from the inward end of a card that is pressed against said closure part to move said closure part out of line with said slot.

12. The PC card described in claim 11 wherein:

said closure part has a surface with a portion that is angled at an outward downward incline so a largely inward face applied by a card to said surface causes said closure part to move down.

13. The PC card described in claim 1 wherein:

said circuit board has an upper face and said small-card connector has a connector housing with an upper portion for lying on said circuit board upper face and with a plurality of blocks extending below said upper portion;

said circuit board has a plurality of through apertures, each of a width and length that are each at least 10% of the width and length, respectively of said connector housing;

each of said blocks has a shape and size complementary to one of said apertures and extends downwardly into one of said apertures.

14. A small card connector for mounting in a PC card that has a circuit board with conductive traces, comprising:

a card connector having an insulative connector housing forming means for mounting on said circuit board, said connector housing having a pair of opposite edge guides for guiding opposite edges of a small smart card, said edge guides defining a horizontal guide plane between them;

a plurality of contacts mounted on said connector housing, said contact having pad-contacting ends positioned to ends positioned to engage a small smart card lying in said plane and having tails for engaging said circuit board traces;

a closure device including a pair of arms having inner arm ends mounted on said connector housing and having outer arm ends and a closure part mounted on said arm outer ends, with said arm outer ends being movable to move said closure part primarily vertically between a closed position in line with said guide plane and an open position vertically spaced from said guide plane.

15. The small card connector described in claim 14 wherein:

said connector housing has a main part for lying on and above said circuit board, with said edge guides formed by said main part, and said means for mounting includes a plurality of feet for projecting down through and below said circuit board;

said feet project down from said housing by at least 2 mm and the height of said connector housing is between 4 mm and 5 mm, so said connector housing extends along the entire internal height of a type II PCMCIA card so as to support the upper and lower walls of the PCMCIA card on each other.

16. The small card connector described in claim 14 wherein:

said card connector housing including a stationary body and a carriage slidable mounted on said body with said carriage forming said opposite edge guide.

17. The small card connector described in claim 16 wherein:

said carriage has a hollow facing upwardly, for receiving a tool to slide the carriage outwardly.

18. The small card connector described in claim 16 including:

a spring that urges said carriage outwardly, with said closure device forming a stop to prevent outward card and carriage movement unless said closure part is depressed.

19. A PC card comprising:

a circuit board;

a PC card housing which includes a sheet metal shell which surrounds said circuit board, said shell having vertical sides, upper and lower planar main walls which each covers most of said circuit board, and upper peripheral wall portions which lie at laterally opposite sides of said upper main wall, with each of said upper peripheral wall portions including a horizontal wall part and a largely vertical wall part extending from a side of said upper planar main wall down to said horizontal part;

a small card connector lying in said PC card housing and having walls forming a recess for receiving a small smart card of predetermined size that has surface contact pads, with said connector having contacts for engaging the small card contact pads;

said largely vertical wall part of one of said upper peripheral wall portions, has a slot for passing said small smart card, with said recess lying in line with said slot to receive a small smart card inserted through said slot.

20. The PC card described in claim 19 wherein:

a closure device having a closure part biased up toward a position wherein it blocks said slot, with said closure part being movable down to unblock said slot.

21. A method for using a PC card that is constructed in accordance with PCMCIA standards to install a small smart card with contact pads into a PCMCIA host that has a passageway and a host connector at the rear of the passageway, wherein said PC card has front and rear ends with a rear connector with contacts at said rear end and wherein said PC card has upper and lower walls and laterally opposite sides, wherein said upper wall includes an upper main wall and an upper periphery wall portion that has a largely vertical wall part, comprising:

inserting said small smart card laterally through a slot in said largely vertical wall part until said small smart card lies completely within said PC card and said contact pads are coupled to said contacts of said rear connector, and then sliding said PC card rearwardly into a host passage until said rear connector mates with said host connector.

22. Apparatus for use in a PC card to connect to a smart card (C) which has upper and lower surfaces, opposite sides, an inward edge (98), and an outward edge (99), where the connector has walls (70,92,94,44) that define a slot (80) into which the smart card can be inserted, where one of said walls (44) is an upper wall formed of sheet metal, wherein:

said sheet metal upper wall (44) has a downwardly extending boss (120) formed therein at an outward (0) end of said slot at a position to help prevent said smart card from accidentally escaping from the slot.

23. The apparatus described in claim 22 wherein:

said outward edge (99) of said smart card has a first part that extends parallel to said inward edge (98) and has a second part (116) that extends at an incline to said first part, with said boss being positioned to engage said inclined second part.

24. A PC card having a cover with upper and lower sheet metal walls lying in horizontal planes and having a horizontal card-receiving slot lying between said walls for receiving a small smart card along a horizontal path into said PC card until an inner end of the smart card lies at a predetermined position, wherein:

one of said sheet metal walls has a notch (114) therein that lies in line with said predetermined position to enable a tool to be projected through said slot to push said inner end of the smart card automatically.

* * * * *